US008704361B2

(12) United States Patent
Takahashi

(10) Patent No.: US 8,704,361 B2
(45) Date of Patent: Apr. 22, 2014

(54) SEALING GLASS FOR SEMICONDUCTOR DEVICE, SEALING MATERIAL, SEALING MATERIAL PASTE, AND SEMICONDUCTOR DEVICE AND ITS PRODUCTION PROCESS

(75) Inventor: Hiroki Takahashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 96 days.

(21) Appl. No.: 13/362,690

(22) Filed: Jan. 31, 2012

(65) Prior Publication Data

US 2012/0139133 A1    Jun. 7, 2012

Related U.S. Application Data

(63) Continuation of application No. PCT/JP2010/062851, filed on Jul. 29, 2010.

(30) Foreign Application Priority Data

Jul. 31, 2009    (JP) ................................. 2009-179234

(51) Int. Cl.
*H01L 23/10*    (2006.01)
*B28B 11/00*    (2006.01)

(52) U.S. Cl.
USPC ................... 257/710; 257/794; 257/E23.113; 257/E23.117; 257/E23.18; 428/34; 428/34.5; 65/43

(58) Field of Classification Search
USPC .......... 257/710, 794, E21.502, E23.117, 622, 257/777, E23.067, E23.193, E23.18, 257/E23.113; 438/127; 501/41, 46; 428/34, 428/34.5; 65/43
See application file for complete search history.

(56) References Cited

U.S. PATENT DOCUMENTS

| 4,349,635 A | * | 9/1982 | Davis et al. ..................... 501/15 |
| 4,761,518 A | * | 8/1988 | Butt et al. ..................... 174/538 |
| 4,796,149 A | | 1/1989 | Seike et al. |
| 5,315,155 A | * | 5/1994 | O'Donnelly et al. ......... 257/711 |

(Continued)

FOREIGN PATENT DOCUMENTS

| DE | 10 2007 054 437 A1 | 5/2009 |
| JP | 58-161943 | 9/1983 |

(Continued)

OTHER PUBLICATIONS

International Search Report mailed Sep. 21, 2010 in PCT/JP2010/062851 filed Jul. 29, 2010.

*Primary Examiner* — Jasmine Clark
(74) *Attorney, Agent, or Firm* — Oblon, Spivak, McClelland, Maier & Neustadt, L.L.P.

(57) ABSTRACT

A sealing glass, a sealing material, and a sealing material paste, which suppress metal deposition by reducing glass components (metal oxides) without decreasing the reactivity with and the adhesion to a semiconductor substrate. The sealing glass, contains a low temperature melting glass containing, by mass ratio: from 0.1 to 5% of at least one metal oxide selected from the group consisting of Fe, Mn, Cr, Co, Ni, Nb, Hf, W, Re, a rare earth element, and optionally Mo; and from 5 to 100 ppm by mass ratio of $K_2O$, wherein the low temperature melting glass has a softening point of at most 430° C. The sealing material device, contains the sealing glass and an inorganic filler in an amount of from 0 to 40% by volume ratio. The sealing material paste contains a mixture of the sealing material and a vehicle.

13 Claims, 1 Drawing Sheet

(56) References Cited

U.S. PATENT DOCUMENTS

| | | | |
|---|---|---|---|
| 5,455,386 A * | 10/1995 | Brathwaite et al. | 174/529 |
| 6,274,252 B1 * | 8/2001 | Naugler et al. | 428/621 |
| 2008/0188035 A1 | 8/2008 | Seppala et al. | |

FOREIGN PATENT DOCUMENTS

| | | |
|---|---|---|
| JP | 63-136424 | 6/1988 |
| JP | 5-343553 | 12/1993 |
| JP | 2002-249339 | 9/2002 |
| JP | 2003-146691 | 5/2003 |
| JP | 2007-210870 | 8/2007 |
| JP | 2007-524112 | 8/2007 |
| JP | 2007-528591 | 10/2007 |
| JP | 2007-320822 | 12/2007 |
| JP | 2008-244442 | 10/2008 |
| JP | 2008-247682 A | 10/2008 |
| WO | 2004/106221 | 12/2004 |

* cited by examiner

US 8,704,361 B2

SEALING GLASS FOR SEMICONDUCTOR DEVICE, SEALING MATERIAL, SEALING MATERIAL PASTE, AND SEMICONDUCTOR DEVICE AND ITS PRODUCTION PROCESS

TECHNICAL FIELD

The present invention relates to a sealing glass for a semiconductor device, a sealing material, a sealing material paste, and a semiconductor device and its production process.

BACKGROUND ART

To MEMS (Micro Electro Mechanical Systems) such as a pressure sensor, an acceleration sensor, a gyrosensor, a micromirror and an optical modulator, and optical devices having a CCD element or a CMOS element applied, a package wherein the element portion is open to the above is employed (Patent Documents 1 and 2). Further, to achieve the downsizing and the weight saving of a semiconductor device such as an optical device or a MEMS, application of a packaging structure (such as chip size package (CSP)) wherein a sealing substrate comprising a semiconductor substrate, a glass substrate or the like is directly bonded to a semiconductor substrate having a sensor element, a CMOS element or the like provided, is in progress.

To bond a semiconductor substrate (a semiconductor substrate for an element) having a sensor element, a CMOS element or the like formed and a sealing substrate comprising a semiconductor substrate, a glass substrate or the like, a resin, a metal material such as Au—Sn solder, a glass material or the like is used. The sensor element, the CMOS element or the like provided on the semiconductor substrate for an element is required to be airtightly sealed, and particularly an element constituting the MEMS is commonly airtightly sealed in a vacuum state. Among the above-described bonding materials (sealing materials), the resin is poor in the airtightness, and thus it may decrease the reliability of the semiconductor device. Since the metal material such as Au—Sn solder has electrical conductivity, it cannot be directly formed on the semiconductor substrate when insulation is required, and it has such drawbacks that the production cost will increase so as to achieve an insulating package.

As the sealing material (sealing glass) comprising a glass material, usually low temperature melting PbO glass (lead glass) has been used. The sealing glass has such advantages that it is excellent in the airtight sealing properties, the moisture resistance, etc. and that it can directly be formed on the semiconductor substrate since it is an insulating material. However, it has such drawbacks that when a PbO sealing glass or the like having a conventional composition is used as a sealing material for a semiconductor device, components (metal oxides such as PbO) in the sealing glass will be reduced due to the semiconductor substrate (such as a Si substrate) and the atmosphere (particularly vacuum atmosphere) at the time of sealing, whereby metal balls will deposit, whereby the insulation of the semiconductor substrate will be reduced, thus leading to an increase in the surface leak.

To solve such problems, deposition of the metal due to reduction of the glass components (metal oxides) can be suppressed by lowering the sealing temperature (firing temperature of the sealing glass). However, a decrease in the sealing temperature will deteriorate the reactivity of the sealing glass with the semiconductor substrate, thus leading to a decrease in the bond strength and the reliability. Accordingly, in order to use the sealing glass as a sealing material for a semiconductor device, it is important to suppress the deposition of metals by reduction of the glass components (metal oxides) without decreasing the reactivity with and the adhesion to the semiconductor substrate.

PRIOR ART DOCUMENTS

Patent Documents

Patent Document 1: JP-A-2007-528591
Patent Document 2: JP-A-2008-244442

DISCLOSURE OF INVENTION

Technical Problem

The object of the present invention is to provide a sealing glass for a semiconductor device, a sealing material, and a sealing material paste, which make it possible to suppress deposition of metals by reduction of glass components (metal oxides) without decreasing the reactivity with and the adhesion to the semiconductor substrate, and a semiconductor device and its production process, with which the airtight sealing property and the reliability can be increased by using such a material.

Solution to Problem

The sealing glass for a semiconductor device according to the embodiment of the present invention is a sealing glass for a semiconductor device, comprising low temperature melting glass having a softening point of at most 430° C., wherein the low temperature melting glass comprises from 0.1 to 5% by mass ratio of an oxide of at least one metal selected from the group consisting of Fe, Mn, Cr, Co, Ni, Nb, Hf, W, Re and rare earth elements, and from 5 to 100 ppm by mass ratio of $K_2O$. Further, the above group may further contain Mo.

The sealing material for a semiconductor device according to the embodiment of the present invention comprises the sealing glass according to the embodiment of the present invention, and an inorganic filler in an amount of from 0 to 40% by volume ratio. The sealing material paste for a semiconductor device according to the embodiment of the present invention comprises a mixture of the sealing material according to the embodiment of the present invention and a vehicle.

The semiconductor device according to the embodiment of the present invention comprises a semiconductor substrate for an element, having a surface provided with an element portion and a first sealing region; a sealing substrate having a surface provided with a second sealing region corresponding to the first sealing region, disposed so that the surface faces the surface of the semiconductor substrate for an element; and a sealing layer comprising a melt-bonded layer of a sealing material formed between the first sealing region of the semiconductor substrate for an element and the second sealing region of the sealing substrate so as to seal the element portion; wherein the sealing material contains a sealing glass comprising low temperature melting glass having a softening point of at most 430° C., comprising from 0.1 to 5% by mass ratio of an oxide of at least one metal selected from the group consisting of Fe, Mn, Cr, Co, Ni, Nb, Hf, W, Re and rare earth elements, and from 5 to 100 ppm by mass ratio of $K_2O$. Further, the above group may further contain Mo.

The process for producing a semiconductor device according to the embodiment of the present invention comprises a step of preparing a semiconductor substrate for an element having a surface provided with an element portion and a first sealing region provided so as to surround the element portion; a step of preparing a sealing substrate having a surface provided with a second sealing region corresponding to the first sealing region; a step of forming a sealing material layer comprising a fired layer of a sealing material on the first sealing region of the semiconductor substrate for an element or the second sealing region of the sealing substrate; a step of laminating the semiconductor substrate for an element and the sealing substrate via the sealing material layer so that the surface of the semiconductor substrate for an element and the surface of the sealing substrate face each other; and a step of heating the laminate of the semiconductor substrate for an element and the sealing substrate to melt the sealing material layer thereby to form a sealing layer to seal the element portion; wherein the sealing material contains a sealing glass comprising low temperature melting glass having a softening point of at most 430° C., comprising from 0.1 to 5% by mass ratio of an oxide of at least one metal selected from the group consisting of Fe, Mn, Cr, Co, Ni, Nb, Hf, W, Re and rare earth elements, and from 5 to 100 ppm by mass ratio of $K_2O$. Further, the above group may further contain Mo.

Advantageous Effects of Invention

According to the sealing glass for a semiconductor device according to the embodiment of the present invention, deposition of metals by reduction of glass components (metal oxides) can be suppressed while the reactivity with and the adhesion to the semiconductor substrate are increased. Accordingly, by a semiconductor device and its production process using such a sealing glass, it is possible to improve the airtight sealing property and the reliability of the semiconductor device.

DESCRIPTION OF EMBODIMENTS

Figure 1:
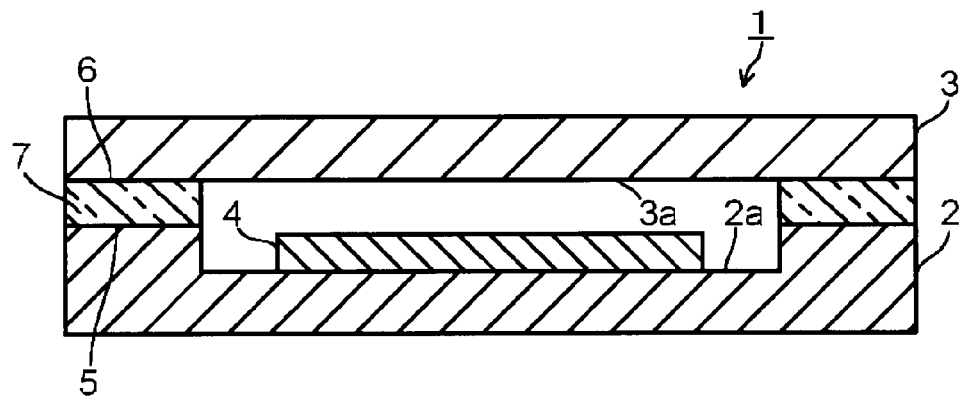
FIG. 1 is a cross-sectional view illustrating the constitution of a semiconductor device according to the embodiment of the present invention.

Now, the present invention will be described in detail below. The sealing glass for a semiconductor device according to the embodiment is used to seal (bond) a semiconductor substrate (a semiconductor substrate (such as a Si substrate) for an element) having an element portion provided thereon, and a sealing substrate comprising a semiconductor substrate (such as a Si substrate), a glass substrate, a ceramic substrate or the like. The sealing glass according to this embodiment comprises low temperature melting glass having a softening point of at most 430° C., and the low temperature melting glass comprises from 0.1 to 5% by mass ratio of an oxide of at least one metal (hereinafter referred to as metal M) selected from the group consisting of Fe, Mn, Cr, Co, Ni, Nb, Hf, W, Re and rare earth elements, and from 5 to 100 ppm by mass ratio of $K_2O$. Further, the above group may further contain Mo.

For the low temperature melting glass constituting the sealing glass, low temperature melting glass such as bismuth glass, tin-phosphate glass, vanadium glass or lead glass, having a softening point of at most 430° C., is used. Among them, considering the influences over the environment and the human body, etc., it is preferred to use bismuth glass, tin-phosphate glass or vanadium glass, containing substantially no lead, and it is more preferred to use bismuth glass or tin-phosphate glass. If the softening point of the low temperature melting glass exceeds 430° C., elements (such as Si—Au eutectic crystals) constituting an element portion of a semiconductor device may be impaired.

The softening point of the low temperature melting glass of the present invention is preferably at most 420° C., and preferably at least 350° C.

The bismuth glass as the low temperature melting glass preferably has a composition comprising, by mass ratio, from 70 to 90% of $Bi_2O_3$, from 1 to 20% of ZnO and from 2 to 18% of $B_2O_3$. The composition of the bismuth glass more preferably comprises, by mass ratio, from 75 to 86% of $Bi_2O_3$, from 5 to 12% of ZnO and from 5 to 16% of $B_2O_3$. $Bi_2O_3$ is a component to form a glass network. If the content of $Bi_2O_3$ is less than 70 mass %, the softening point of the low temperature melting glass will be high, whereby sealing at low temperature will be difficult. If the content of $Bi_2O_3$ exceeds 90 mass %, the glass will hardly be vitrified and in addition, the thermal expansion coefficient tends to be too high.

ZnO is a component to lower the thermal expansion coefficient or the like, and further lower the refractoriness under load. If the content of ZnO is less than 1 mass %, the glass will hardly be vitrified. If the content of ZnO exceeds 20 mass %, the stability at the time of formation of the low temperature melting glass will be decreased, and devitrification is likely to occur. $B_2O_3$ is a component to form a glass network and to broaden a range within which the glass can be vitrified. If the content of $B_2O_3$ is less than 2 mass %, the glass will hardly be vitrified, and if it exceeds 18 mass %, the softening point will be too high, whereby sealing at low temperature will be difficult even if a load is applied at the time of the sealing.

The glass (glass frit) formed by the above three components has a low glass transition point and is suitable as a sealing material at low temperature, and it may further contain an optional component such as $Al_2O_3$, $SiO_2$, CaO, SrO, BaO, $P_2O_5$ or $SnO_x$ (wherein x is 1 or 2). However, if the content of the optional components is too high, the glass will be unstable, whereby devitrification may occur, or the glass transition point or the softening point may be increased. Thus, the total content of the optional components is preferably at most 30 mass %. The total content of the optional components is more preferably at most 15 mass %, further preferably at most 5 mass %.

Tin-phosphate glass preferably has a composition comprising, by mass ratio, from 45 to 68% of SnO, from 2 to 10% of $SnO_2$ and from 20 to 40% of $P_2O_5$. The composition of the tin-phosphate glass more preferably comprises, by mass ratio, from 55 to 65% of SnO, from 2 to 5% of $SnO_2$ and from 25 to 35% of $P_2O_5$. SnO is a component to make the glass have a low melting point. If the content of SnO is less than 45 mass %, the viscosity of the glass will be high, whereby the sealing temperature tends to be too high, and if it exceeds 68 mass %, the glass will not be vitrified.

$SnO_2$ is a component to stabilize glass. If the content of $SnO_2$ is less than 2 mass %, $SnO_2$ will be separated and precipitate in the glass softened and melted at the time of the sealing operation, and the fluidity will be impaired and the sealing operation property will be decreased. If the content of $SnO_2$ exceeds 10 mass %, $SnO_2$ is likely to precipitate in the melt of the low temperature melting glass. $P_2O_5$ is a component to form a glass network. If the content of $P_2O_5$ is less than 20 mass %, the glass will not be vitrified, and if the content exceeds 40 mass %, deterioration of the weather resistance which is a drawback specific to phosphate glass may occur.

Here, the ratios (mass %) of SnO and $SnO_2$ in the glass frit can be determined as follows. First, the glass frit (low temperature melting glass powder) is subjected to acid decomposition, and then the total amount of Sn atoms contained in the glass frit is measured by ICP emission spectroscopy. Then, the amount of $Sn^{2+}$ (SnO) can be obtained by the iodometric titration after the acid decomposition, and thus the amount of $Sn^{4+}$ ($SnO_2$) is determined by subtracting the above obtained amount of $Sn^{2+}$ from the total amount of the Sn atoms.

The glass formed by the above three components has a low glass transition point and is suitable as a sealing material at low temperature, and it may contain an optional component such as $SiO_2$, ZnO, $B_2O_3$, $Al_2O_3$, MgO, CaO, SrO or BaO. However, if the content of the optional components is too high, the glass will be unstable, whereby devitrification may occur, or the glass transition point or the softening point may be increased. Thus, the total content of the optional components is preferably at most 30 mass %. The total content of the optional components is more preferably at most 20 mass %, further preferably at most 10 mass %.

Vanadium glass preferably has a composition comprising, by mass ratio, from 50 to 80% of $V_2O_5$ and from 15 to 45% of $P_2O_5$. The composition of the vanadium glass more preferably comprises, by mass ratio, from 50 to 70% of $V_2O_5$ and from 15 to 25% of $P_2O_5$. If the content of $V_2O_5$ is less than 50 mass %, the softening point of the low temperature melting glass will be high, and sealing at low temperature will be difficult. If the content of $V_2O_5$ exceeds 80 mass %, the glass will hardly be vitrified and in addition, the reliability of the sealing glass such as the weather resistance tends to be low. If the content of $P_2O_5$ is less than 15 mass %, the glass will hardly be vitrified. If the content of $P_2O_5$ exceeds 45 mass %, the softening point will be too high, whereby sealing at low temperature will be difficult.

The vanadium glass may contain from 5 to 25 mass % of $Sb_2O_3$ or from 1 to 15 mass % of BaO, or the like, and it may further contain $SiO_2$, $Al_2O_3$, MgO, CaO, SrO, $SnO_x$ (wherein x is 1 or 2) or the like. However, if the content of optional components is too high, the glass will be unstable and devitrification may occur, or the glass transition point or the softening point may be increased. Accordingly, the total content of the optional components is preferably at most 50 mass %. The total content of the optional components is more preferably at most 40 mass %, further preferably at most 35 mass %.

Lead glass preferably has a composition comprising, by mass ratio, from 75 to 90% of PbO and from 5 to 20% of $B_2O_3$. The composition of the lead glass more preferably comprises, by mass ratio, from 75 to 85% of PbO and from 10 to 15% of $B_2O_3$. If the content of PbO is less than 75 mass %, the softening point of the low temperature melting glass tends to be high, and sealing at low temperature will be difficult. If the content of PbO exceeds 90 mass %, the glass is likely to be crystallized when it is melted and in addition, the fluidity will be increased at the time of sealing. If the content of $B_2O_3$ is less than 5 mass %, the glass will hardly be vitrified, and if it exceeds 20 mass %, the softening point tends to be too high, whereby sealing at low temperature will be difficult.

The lead glass may contain at most 5 mass % of ZnO, at most 4 mass % of $SiO_2$, at most 2 mass % of $Al_2O_3$, at most 2 mass % of BaO, at most 4 mass % of $SnO_2$ or the like, and it may further contain $Bi_2O_3$, MgO, CaO, SrO or the like. However, if the content of optional components is too high, the glass will be unstable, whereby devitrification may occur, or the glass transition point or the softening point may be increased. Accordingly, the total content of the optional components is preferably at most 30 mass %. The total content of the optional components is more preferably at most 15 mass %, further preferably at most 7 mass %.

The sealing glass (glass frit) according to this embodiment further contains, in addition to the above-described basic components of the low temperature melting glass, from 0.1 to 5% by mass ratio of an oxide of at least one metal M selected from the group consisting of Fe, Mn, Cr, Co, Ni, Nb, Hf, W, Re and rare earth elements, and from 5 to 100 ppm by mass ratio of $K_2O$. Further, the above group may further contain Mo. The composition of the sealing glass is adjusted so that the total content of the basic components of the low temperature melting glass, the oxide of the metal M and $K_2O$, or the total content further including the optional components, is basically 100 mass %.

$K_2O$ is a component to improve the adhesion between the sealing glass and the semiconductor substrate. Here, although oxides of alkali metals other than $K_2O$, such as $Li_2O$ and $Na_2O$, function as a component to improve the adhesion to the semiconductor substrate (such as a Si substrate), they may cause an increase in the surface leak current of the semiconductor substrate. Whereas, $K_2O$ has a large atomic radius as compared with $Li_2O$, $Na_2O$ and the like and thereby has a small mobility, and accordingly the increase in the surface leak current of the semiconductor substrate will be suppressed.

As mentioned above, $K_2O$ is a component to improve the adhesion between the sealing glass and the semiconductor substrate (such as a Si substrate) while adverse effects (such as an increase in the surface leak current) on the semiconductor substrate and thus a semiconductor device are suppressed. If the content of $K_2O$ is less than 5 ppm, no sufficient effect of improving the adhesion to the semiconductor substrate will be obtained, and if it exceeds 100 ppm, the surface leak current may be increased. The content of $K_2O$ is more preferably within a range of from 10 to 50 ppm.

Oxides of alkali metals other than $K_2O$, such as $Li_2O$ and $Na_2O$, may increase the surface leak current of the semiconductor substrate. Particularly, $Li_2O$ is likely to have adverse effects on the properties and the reliability of the semiconductor device, and accordingly it is preferred to reduce the $Li_2O$ amount in the sealing glass. Specifically, the content of $Li_2O$ in the sealing glass is preferably at most 30 ppm by mass ratio. As described above, the sealing glass preferably contains from 5 to 100 ppm of $K_2O$, and has a $Li_2O$ content of at most 30 ppm. The content of $Li_2O$ is more preferably at most 10 ppm by mass ratio.

An oxide of the above-described metal M (at least one member selected from the group consisting of Fe, Mn, Cr, Co, Ni, Nb, Hf, W, Re and rare earth elements) is a component to suppress deposition of metal particles by reduction of the components constituting the low temperature melting glass. Further, the above group may further contain Mo. Among the above-described low temperature melting glasses, in the case of the lead glass, PbO may be reduced at the time of sealing (firing), whereby Pb particles are deposited on the semiconductor substrate. The same applies to the other low temperature melting glasses, and the metal oxide ($Bi_2O_3$ in the case of the bismuth glass, SnO in the case of the tin-phosphate glass and $V_2O_5$ in the case of the vanadium glass) as the main component is reduced at the time of sealing, whereby metal particles are deposited on the substrate surface.

Whereas, the metal M has a plurality of ion valency, and it has such a property that although it is likely to be reduced in an ionic state (for example, 3+ to 2+, or 4+ to 3+), it is hardly reduced to the metal state. Accordingly, when the sealing glass is fired, the oxide of the metal M functions as a supply source of oxygen, whereby deposition of the component constituting the low temperature melting glass as metal particles is suppressed. The oxide itself of the metal M is hardly reduced to the metal state, whereby deposition of the metal can be suppressed. Further, although a monovalent metal may increase the surface leak current, the metal M is not in a monovalent state, and accordingly, it is a component preferred in such a viewpoint also.

Further, by use of the oxide of the metal M with $K_2O$ in combination, the supply of oxygen at the time of sealing will be improved, whereby deposition of the metal particles is more effectively suppressed. That is, if an oxide of an alkali metal such as $K_2O$ is present in the glass, the alkali metal ions break the glass network. The terminal of the network is $[—O^{(-)}R^{(+)}]$, and the alkali metal ions are present as monovalent cation ($R^{(+)}$).

When the oxide of the metal M ($M_xO_y$) is present in the vicinity of the above $R^{(+)}$ group, electrons present in one oxygen atom of $M_xO_y$ are attracted by the alkali metal ion ($R^{(+)}$) and are in the metastable state in a state of $[—O^{(-)}R^{(+)}\ldots O^{(-)}\text{-}(M_xO_{y-1})^{(+)}]$. When oxygen moves from the sealing glass toward the semiconductor substrate side, this oxygen in the metastable state is used. Accordingly, reduction of the components constituting the low temperature melting glass is suppressed. Further, although the metal M may be in a plurality of valence states, it is hardly reduced to the metal state, whereby the metal M is not deposited as the metal particles.

The content of the oxide of the metal M in the sealing glass is within a range of from 0.1 to 5 mass %. If the content of the oxide of the metal M is less than 0.1 mass %, the supply of oxygen in the sealing glass will be insufficient, and deposition of metal particles due to the reduction of the components constituting the low temperature melting glass cannot sufficiently be suppressed. On the other hand, if the content of the oxide of the metal M exceeds 5 mass %, the glass will be unstable and devitrification may occur, or the glass transition point or the softening point may be increased. The content of the oxide of the metal M is more preferably within a range of from 0.1 to 3.5 mass %.

Each of the metals M has the above-described effect, and among such metals M, it is particularly preferred to use a rare earth element. A rare earth element functions as a component to reduce the damage on a melting bath at the time of melting the glass, in addition to suppressing reduction of the components constituting the low temperature melting glass thereby to suppress deposition of the metal particles. This is considered to be because of a property such that it is more likely to be reduced even at high temperature for melting the glass. The type of the rare earth element is not particularly limited, and it may be lanthanoid including Sc and Y, and it is preferably at least one member selected from the group consisting of Ce, Eu, Yb, Pr, Nd, Tb and Tm. These elements have a property such that they are more likely to be reduced in an ionic state, whereby deposition of the metal particles can more effectively be suppressed.

The sealing material according to this embodiment is constituted by the above-described sealing glass (glass frit) and as the case requires, an inorganic filler such as a low-expansion filler blended. The amount of the inorganic filler is properly set depending upon the purpose of use, but is preferably at most 40 vol % relative to the sealing material. If the amount of the inorganic filler exceeds 40 vol %, the fluidity of the sealing material at the time of sealing may be decreased, whereby the bond strength may be decreased. It is more preferably at most 20 vol %. The sealing material comprises the sealing glass and from 0 to 40 vol % of the inorganic filler.

The lower limit of the content of the inorganic filler is not particularly limited, and in some cases, it is possible to constitute the sealing material only with the sealing glass.

As a representative example of the inorganic filler, a low-expansion filler may be mentioned. The low-expansion filler is one having a thermal expansion coefficient lower than that of the sealing glass. The sealing material may contain an inorganic filler other than the low-expansion filler. The content of the low-expansion filler is preferably at most 40 vol % as described above. The lower limit of the content of the low-expansion filler is not particularly limited and is properly set depending upon the difference in the thermal expansion coefficient between the sealing glass and the semiconductor substrate for an element or the sealing substrate. However, in order to obtain practical effects by blending, the low-expansion filler is preferably blended in an amount of at least 5 vol %. The content of the low-expansion filler is more preferably from 5 to 20 vol %.

As the low-expansion filler, it is preferred to use at least one member selected from the group consisting of silica, alumina, zirconia, zirconium silicate, aluminum titanate, mullite, cordierite, eucryptite, spodumene, a zirconium phosphate compound, a tin oxide compound and a quartz solid solution. The zirconium phosphate compound may, for example, be $(ZrO)_2P_2O_7$, $NaZr_2(PO_4)_3$, $KZr_2(PO_4)_3$, $Ca_{0.5}Zr_2(PO_4)_3$, $NbZr(PO_4)_3$, $Zr_2(WO_3)(PO_4)_2$ or a composite compound thereof. The inorganic filler other than the low-expansion filler may be titania or a composite oxide pigment. The composite oxide pigment may be $(Co, Fe, Mn)(Fe, Cr, Mn)_2O_4$, $(Fe, Mn)(Fe, Mn)_2O_4$, $(Fe, Zn)(Fe, Cr)_2O_4$, $(Ni, Fe)(Cr, Fe)_2O_4$, $Cu(Cr, Mn)_2O_4$, $Cu(Co, Mn)_2O_4$, $CuCr_2O_4$ or $CoAl_2O_4$.

The sealing material paste according to this embodiment comprises a mixture of the sealing material with a vehicle. The vehicle may, for example, be one having a binder component such as methyl cellulose, ethyl cellulose, carboxymethyl cellulose, oxyethyl cellulose, benzyl cellulose, propyl cellulose or nitrocellulose dissolved in a solvent such as terpineol, butyl carbitol acetate or ethyl carbitol acetate, or one having an acrylic resin (binder component) of e.g. methyl (meth)acrylate, ethyl(meth)acrylate, butyl(meth)acrylate or 2-hydroxyethyl methacrylate dissolved in a solvent such as methyl ethyl ketone, terpineol, butyl carbitol acetate or ethyl carbitol acetate.

The mixing ratio of the sealing material and the vehicle is properly set depending upon e.g. the desired paste viscosity and is not particularly limited. The viscosity of the sealing material paste is fitted to the viscosity in accordance with an apparatus which applies the paste to the sealing substrate or the semiconductor substrate for an element and may be adjusted by the mixing ratio of the organic resin (binder component) to the solvent or the mixing ratio of the sealing material to the vehicle. The sealing material paste may contain known additives for a glass paste, such as an antifoaming agent or a dispersing agent. For preparation of the sealing material paste, a known method employing a rotary mixer equipped with a stirring blade, a roll mill, a ball mill or the like may be applied.

The above-described sealing glass, sealing material and sealing material paste are used in a step of sealing a semiconductor device (a step of bonding the semiconductor substrate for an element and the sealing glass). FIG. 1 illustrates an example of the constitution of a semiconductor device using the sealing glass, the sealing material and the sealing material paste according to this embodiment. The semiconductor device 1 shown in FIG. 1 is to constitute a MEMS such as a pressure sensor, an acceleration sensor, a gyrosensor, a micromirror or an optical modulator, an optical device having a CCD element or a CMOS element applied, or the like, but the semiconductor device 1 is not limited thereto.

The semiconductor device 1 comprises a semiconductor substrate 2 for an element and a sealing substrate 3. To the semiconductor substrate 2 for an element, various semiconductor substrates represented by a Si substrate are applied. As the sealing substrate 3, a semiconductor substrate (such as a Si substrate), a glass substrate, a ceramic substrate or the like is used. On a surface 2a of the semiconductor substrate 2 for an element, an element portion 4 in accordance with the semiconductor device 1 is provided. The element portion 4 comprises a sensor element, a mirror element, an optical modulation element or the like, and each of them has a known structure. The semiconductor device 1 is by no means restricted to the structure of the element portion 4.

On the surface 2a of the semiconductor substrate 2 for an element, a first sealing region 5 is provided along the periphery of the element portion 4. The first sealing region 5 is provided so as to surround the element portion 4. On a surface 3a of the sealing substrate 3, a second sealing region 6 corresponding to the first sealing region 5 is provided. The semiconductor substrate 2 for an element and the sealing substrate 3 are disposed with a certain distance so that the surface 2a having the element portion 4 and the first sealing region 5 and the surface 3a having the second sealing region 6 face each other. The space between the semiconductor substrate 2 for an element and the sealing substrate 3 is sealed by a sealing layer 7.

The sealing layer 7 is formed between the sealing region 5 of the semiconductor substrate 2 for an element and the sealing region 6 of the sealing substrate 3 so as to seal the element portion 4. The element portion 4 is airtightly sealed in a package comprising the semiconductor substrate 2 for an element, the sealing substrate 3 and the sealing layer 7. The sealing layer 7 comprises a melt-bonded layer of the sealing material according to this embodiment. The interior of the package is airtightly sealed in a state in accordance with the semiconductor device 1. For example, in a case where the semiconductor device 1 is a MEMS, it is common that the interior in the package is airtightly sealed in a vacuum state.

Figure 2:
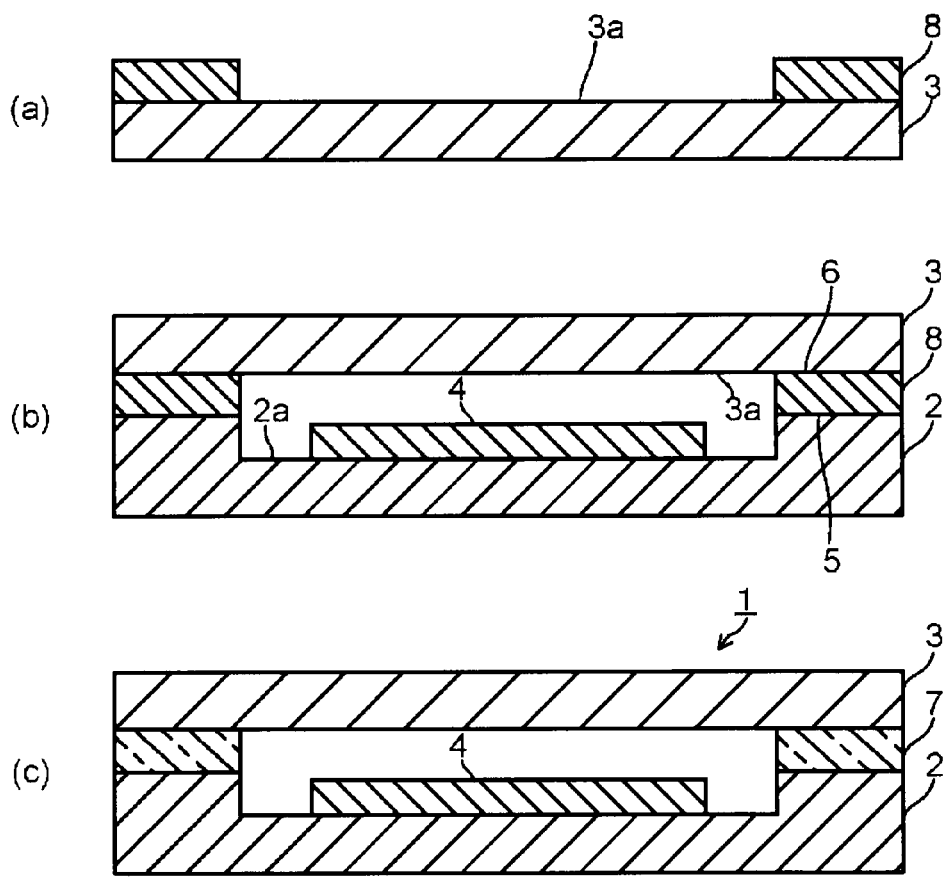
FIG. 2 is cross-sectional views illustrating the procedure for production of a semiconductor device according to the embodiment of the present invention.

Now, the procedure for production of the semiconductor device 1 according to this embodiment will be described with reference to FIG. 2. First, as shown in FIG. 2(*a*), a sealing material layer (fired layer of the sealing material) 8 is formed on the sealing region 6 of the sealing substrate 3. For formation of the sealing material layer 8, first, a sealing material paste is applied to the sealing region 6 and dried to form a coating layer of the sealing material paste. Specific constitutions of the sealing material and the sealing material paste are as described above.

The sealing material paste is applied to the sealing region 6 employing, for example, a printing method such as screen printing or gravure printing, or applied along the sealing region 6 using a disperser or the like. The coating layer of the sealing material paste is dried, for example, at a temperature of at least 120° C. for at least 10 minutes. The drying step is carried out to remove the solvent in the coating layer. If the solvent remains in the coating layer, the binder component may not sufficiently be removed in the following firing step.

The above coating layer of the sealing material paste is fired to form a sealing material layer 8. In the firing step, first, the coating layer is heated to a temperature of at most the glass transition point of the sealing glass (glass frit) as the main component of the sealing material to remove the binder component in the coating layer, and then it is heated to a temperature of at least the softening point of the sealing glass (glass frit) to melt the glass material for sealing thereby to burn it on the sealing substrate 3. The heating temperature at the time of burning is preferably a temperature higher by from 0 to 80° C. than the softening point of the sealing glass. Further, the heating time is preferably from 5 minutes to 1 hour. In such a manner, the sealing material layer 8 comprising a fired layer of the sealing material is formed.

Then, as shown in FIG. 2(*b*), the sealing substrate 3 having the sealing material layer 8 and a semiconductor substrate 2 for an element having an element portion 4 prepared separately are laminated via the sealing material layer 8 so that the surface 2a and the surface 3a face each other. On the element portion 4 of the semiconductor substrate 2 for an element, a space is formed based on the thickness of the sealing material layer 8. Then, the laminate of the sealing substrate 3 and the semiconductor substrate 2 for an element is heated to a temperature of at least the softening point of the sealing glass in the sealing material layer 8 to melt and solidify the sealing glass, whereby a sealing layer 7 to airtightly seal a space between the semiconductor substrate 2 for an element and the sealing substrate 3 is formed (FIG. 2(*c*)). The heating temperature is preferably a temperature higher by from 0 to 80° C. than the softening point of the sealing glass. Further, the heating time is preferably from 5 minutes to 1 hour.

In this procedure, since the sealing glass contains $K_2O$ excellent in the reactivity with the semiconductor substrate 2, the adhesion between the semiconductor substrate 2 and the sealing layer 7, i.e. the airtight sealing property by the sealing layer 7 can be increased. Further, since the sealing glass contains an oxide of the metal M, deposition of metal particles by reduction of glass components (metal oxides) can be suppressed. Accordingly, it is possible to provide a semiconductor device 1 excellent in the device properties and the reliability in addition to the airtight sealing property, with good reproducibility.

EXAMPLES

Now, the present invention will be described in detail with reference to specific Examples and the evaluation results. However, it should be understood that the present invention is by no means restricted to the following specific Examples, and modification within the scope of the present invention is possible.

Example 1

First, bismuth glass frit (softening point: 406° C.) having a composition comprising, by mass ratio, 82.8% of $Bi_2O_3$, 5.8% of $B_2O_3$, 10.7% of ZnO, 0.5% of $Al_2O_3$ and 0.2% of $CeO_2$, and further containing, by mass ratio, 50 ppm of $K_2O$, and a cordierite powder as a low-expansion filler were prepared. The $Li_2O$ content of the bismuth glass frit was at most 5 ppm as the detection limit. The contents of $K_2O$ and $Li_2O$ were values analyzed by ICP, and the same applies to the following Examples. Further, 11 mass % of ethyl cellulose as a binder component was dissolved in 89 mass % of a solvent comprising butyl carbitol acetate to prepare a vehicle.

92 vol % of the above-described bismuth glass frit and 8 vol % of the cordierite powder were mixed to prepare a sealing material. 86 mass % of the sealing material was mixed with 14 mass % of the vehicle to prepare a sealing material paste. Then, on the outer peripheral region of a sealing substrate comprising a semiconductor substrate (Si substrate), the sealing material paste was applied (line width: 400 μm) by a screen printing method and dried at 120° C. for 10 minutes.

The resulting coating layer was fired in a heating furnace at 430° C. for 10 minutes to form a sealing material layer having a thickness of 20 µm.

Then, the sealing substrate having the sealing material layer and a semiconductor substrate (Si substrate) for an element having an element portion formed thereon were laminated. The laminate of the sealing substrate and the semiconductor substrate for an element was disposed in a heating furnace and subjected to heat treatment at 430° C. for 10 minutes to seal the sealing substrate and the semiconductor substrate for an element. The semiconductor device thus prepared was subjected to the after-mentioned evaluation of properties.

Examples 2 to 15

A sealing material paste was prepared in the same manner as in Example 1 except that the composition (including the content of $K_2O$) of the bismuth glass frit was changed as identified in Tables 1 and 2. Further, in the same manner as in Example 1 except that the resulting sealing material paste was used, the step of forming the sealing material layer on the sealing substrate, and the step of sealing the sealing substrate and the semiconductor substrate for an element (heating step) were carried out. Each semiconductor device thus prepared was subjected to the after-mentioned evaluation of properties.

Comparative Examples 1 and 2

A sealing material paste was prepared in the same manner as in Example 1 except that the composition (including the content of $K_2O$) of the bismuth glass frit was changed as identified in Table 2. Further, in the same manner as in Example 1 except that the resulting sealing material paste was used and that the temperature as identified in Table 4 was employed as the sealing temperature (heating temperature), the step of forming the sealing material layer on the sealing substrate and the step of sealing the sealing substrate and the semiconductor substrate for an element (heating step) were carried out. Each semiconductor device thus prepared was subjected to the after-mentioned evaluation of properties.

Example 16

Lead glass frit (softening point: 395° C.) having a composition comprising, by mass ratio, 81.0% of PbO, 13.0% of $B_2O_3$, 2.5% of ZnO, 0.5% of $Al_2O_3$ and 3.0% of $CeO_2$, and further containing, by mass ratio, 5 ppm of $K_2O$, and a cordierite powder as a low-expansion filler were prepared. The $Li_2O$ content of the lead glass frit was at most 5 ppm as the detection limit. Further, 10 mass % of ethyl cellulose as a binder component was dissolved in 90 mass % of a solvent comprising butyl carbitol acetate to prepare a vehicle.

91 vol % of the above-described lead glass frit and 9 vol % of the cordierite powder were mixed to prepare a sealing material. 85 mass % of the sealing material was mixed with 15 mass % of the vehicle to prepare a sealing material paste. Then, on the outer peripheral region of a sealing substrate comprising a semiconductor substrate (Si substrate), the sealing material paste was applied (line width: 400 µm) by a screen printing method and dried at 120° C. for 10 minutes. The resulting coating layer was fired in a heating furnace at 430° C. for 10 minutes to form a sealing material layer having a thickness of 20 µm.

Then, the sealing substrate having the sealing material layer and a semiconductor substrate (Si substrate) for an element having an element portion formed thereon were laminated. The laminate of the sealing substrate and the semiconductor substrate for an element was disposed in a heating furnace and subjected to heat treatment at 430° C. for 10 minutes to seal the sealing substrate and the semiconductor substrate for an element. The semiconductor device thus prepared was subjected to the after-mentioned evaluation of properties.

Examples 17 to 19

A sealing material paste was prepared in the same manner as in Example 16 except that the composition (including the content of $K_2O$) of the lead glass frit was changed as identified in Table 2. Further, in the same manner as in Example 16 except that the resulting sealing material paste was used, the step of forming the sealing material layer on the sealing substrate, and the step of sealing the sealing substrate and the semiconductor substrate for an element (heating step) were carried out. Each semiconductor device thus prepared was subjected to the after-mentioned evaluation of properties.

Comparative Examples 3 and 4

A sealing material paste was prepared in the same manner as in Example 16 except that the composition (including the content of $K_2O$) of the lead glass frit was changed as identified in Table 3. Further, in the same manner as in Example 16 except that the resulting sealing material paste was used, the step of forming the sealing material layer on the sealing substrate, and the step of sealing the sealing substrate and the semiconductor substrate for an element (heating step) were carried out. Each semiconductor device thus prepared was subjected to the after-mentioned evaluation of properties.

Example 20

Tin-phosphate glass frit (softening point: 360° C.) having a composition comprising, by mass ratio, 61.5% of SnO, 3.3% of $SnO_2$, 31.4% of $P_2O_5$, 2.7% of ZnO and 1.1% of $Eu_2O_3$ and further containing, by mass ratio, 30 ppm of $K_2O$, and a zirconium phosphate powder as a low-expansion filler were prepared. The content of $Li_2O$ in the tin-phosphate glass frit was at most 5 ppm as the detection limit. Further, 9 mass % of ethyl cellulose as a binder component was dissolved in 91 mass % of a mixed solvent comprising terpineol (71 mass %) and isoamyl acetate (29 mass %) to prepare a vehicle.

91 vol % of the above-described tin-phosphate glass frit and 9 vol % of the cordierite powder were mixed to prepare a sealing material. 77 mass % of the sealing material was mixed with 23 mass % of the vehicle to prepare a sealing material paste. Then, on the outer peripheral region of a sealing substrate comprising a semiconductor substrate (Si substrate), the sealing material paste was applied (line width: 400 µm) by a screen printing method and dried at 120° C. for 10 minutes. The resulting coating layer was fired in a heating furnace at 430° C. for 10 minutes to form a sealing material layer having a thickness of 20 µm.

Then, the sealing substrate having the sealing material layer and a semiconductor substrate (Si substrate) for an element having an element portion formed thereon were laminated. The laminate of the sealing substrate and the semiconductor substrate for an element was disposed in a heating furnace and subjected to heat treatment at 430° C. for 10 minutes to seal the sealing substrate and the semiconductor substrate for an element. The semiconductor device thus prepared was subjected to the after-mentioned evaluation of properties.

Examples 21 to 24

A sealing material paste was prepared in the same manner as in Example 20 except that the composition (including the content of $K_2O$) of the tin-phosphate glass frit was changed as identified in Tables 2 and 3. Further, in the same manner as in Example 20 except that the resulting sealing material paste was used, the step of forming the sealing material layer on the sealing substrate, and the step of sealing the sealing substrate and the semiconductor substrate for an element (heating step) were carried out. Each semiconductor device thus prepared was subjected to the after-mentioned evaluation of properties.

Example 25

Vanadium glass frit (softening point: 400° C.) having a composition comprising, by mass ratio, 52.1% of $V_2O_5$, 18.1% of $P_2O_5$, 11.9% of ZnO, 13.0% of $Sb_2O_3$, 3.9% of BaO and 1.0% of $Yb_2O_3$ and further containing, by mass ratio, 82 ppm of $K_2O$, and a zirconium silicate powder as a low-expansion filler were prepared. The content of $Li_2O$ in the vanadium glass frit was at most 5 ppm as the detection limit. Further, 12 mass % of an acrylic resin as a binder component was dissolved in 88 mass % of a solvent comprising terpineol to prepare a vehicle.

86 vol % of the above-described vanadium glass frit and 14 vol % of the cordierite powder were mixed to prepare a sealing material. 76 mass % of the sealing material was mixed with 24 mass % of the vehicle to prepare a sealing material paste. Then, on the outer peripheral region of a sealing substrate comprising a semiconductor substrate (Si substrate), the sealing material paste was applied (line width: 400 μm) by a screen printing method and dried at 120° C. for 10 minutes. The resulting coating layer was fired in a heating furnace at 430° C. for 10 minutes to form a sealing material layer having a thickness of 20 μm.

Then, the sealing substrate having the sealing material layer and a semiconductor substrate (Si substrate) for an element having an element portion formed thereon were laminated. The laminate of the sealing substrate and the semiconductor substrate for an element was disposed in a heating furnace and subjected to heat treatment at 430° C. for 10 minutes to seal the sealing substrate and the semiconductor substrate for an element. The semiconductor device thus prepared was subjected to the after-mentioned evaluation of properties.

Examples 26 to 28

A sealing material paste was prepared in the same manner as in Example 25 except that the composition (including the content of $K_2O$) of the vanadium glass frit was changed as identified in Table 3. Further, in the same manner as in Example 25 except that the resulting sealing material paste was used, the step of forming the sealing material layer on the sealing substrate, and the step of sealing the sealing substrate and the semiconductor substrate for an element (heating step) were carried out. Each semiconductor device thus prepared was subjected to the after-mentioned evaluation of properties.

Then, with respect to the semiconductor devices in Examples 1 to 28 and Comparative Examples 1 to 4, presence or absence of deposition of metal particles, and the bond strength between the sealing substrate and the semiconductor substrate for an element were evaluated. The measurement/evaluation results are shown in Tables 4 to 8. Presence or absence of the deposition of metal particles was evaluated by observing a cross-section of the device by a SEM. The bond strength between the sealing substrate and the semiconductor substrate for an element was measured based on the die shear strength (MIL-STD-883G (2019.7), and one of at least 2 kg/mm² was evaluated as ◯, and one of less than 2 kg/mm² was evaluated as x. The compositional ratio of the sealing glass in Tables 1 to 3 is represented for convenience assuming the total content of main components as 100 mass %, but the $K_2O$ amount as a trace component is also contained in the total content (100 mass %) of the sealing glass.

TABLE 1

|  |  | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|---|
| Sealing glass/ mass % | $Bi_2O_3$ | 82.8 | 82.3 | 82.5 | 82.5 | 82.5 | 82.5 | 82.5 | 82.5 | 81.0 | 81.0 | 85.0 |
|  | $B_2O_3$ | 5.8 | 5.8 | 5.8 | 5.8 | 5.8 | 5.8 | 5.8 | 5.8 | 5.5 | 6.0 | 11.0 |
|  | ZnO | 10.7 | 10.7 | 10.7 | 10.7 | 10.7 | 10.7 | 10.7 | 10.7 | 9.0 | 8.5 | 3.0 |
|  | $Al_2O_3$ | 0.5 | 0.5 | 0.5 | 0.5 | 0.5 | 0.5 | 0.5 | 0.5 | 0.5 | 1.0 | 0.5 |
|  | $SiO_2$ | — | — | — | — | — | — | — | — | 0.9 | 0.3 | — |
|  | PbO | — | — | — | — | — | — | — | — | — | — | — |
|  | SnO | — | — | — | — | — | — | — | — | — | — | — |
|  | $SnO_2$ | — | — | — | — | — | — | — | — | — | — | — |
|  | $P_2O_5$ | — | — | — | — | — | — | — | — | — | — | — |
|  | BaO | — | — | — | — | — | — | — | — | 1.0 | — | — |
|  | $V_2O_5$ | — | — | — | — | — | — | — | — | — | — | — |
|  | $Sb_2O_3$ | — | — | — | — | — | — | — | — | — | — | — |
|  | $CeO_2$ | 0.2 | 0.2 | — | 0.1 | — | — | — | 0.1 | 0.5 | — | — |
|  | $Eu_2O_3$ | — | — | — | 0.1 | — | — | — | 0.1 | 0.1 | — | — |
|  | $Yb_2O_3$ | — | — | — | — | — | — | — | 0.1 | — | — | — |
|  | $Fe_2O_3$ | — | 0.5 | 0.5 | — | — | — | — | — | 0.5 | 0.5 | — |
|  | $MnO_2$ | — | — | — | 0.3 | — | — | — | — | — | — | — |
|  | $Cr_2O_3$ | — | — | — | — | 0.5 | — | — | — | — | — | — |
|  | $Co_2O_3$ | — | — | — | — | — | 0.5 | — | — | — | — | — |
|  | $Ni_2O_3$ | — | — | — | — | — | — | 0.5 | — | — | — | — |
|  | $Nb_2O_5$ | — | — | — | — | — | — | — | 0.2 | — | — | — |
|  | $MoO_3$ | — | — | — | — | — | — | — | — | 1.0 | — | — |
|  | $HfO_2$ | — | — | — | — | — | — | — | — | — | 0.7 | — |
|  | $WO_3$ | — | — | — | — | — | — | — | — | — | — | 0.5 |

TABLE 1-continued

|  |  | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|---|
|  | $ReO_3$ | — | — | — | — | — | — | — | — | — | — | — |
|  | $K_2O$ (ppm) | 50 | 65 | 61 | 34 | 37 | 59 | 52 | 45 | 29 | 31 | 53 |
|  | $Li_2O$ (ppm) | At most 5 | At most 5 | At most 5 | At most 5 | At most 5 | At most 5 | At most 5 | At most 5 | At most 5 | At most 5 | At most 5 |
| Softening point (° C.) |  | 406 | 407 | 407 | 409 | 409 | 406 | 406 | 410 | 415 | 417 | 400 |

* Ex.: Example of the present invention, Comp. Ex.: Comparative Example

TABLE 2

|  |  | Ex. 12 | Ex. 13 | Ex. 14 | Ex. 15 | Ex. 16 | Ex. 17 | Ex. 18 | Ex. 19 | Ex. 20 | Ex. 21 | Ex. 22 |
|---|---|---|---|---|---|---|---|---|---|---|---|---|
| Sealing glass/ mass % | $Bi_2O_3$ | 78.0 | 75 | 86 | 82.5 | — | — | — | — | — | — | — |
|  | $B_2O_3$ | 16.0 | 7 | 5 | 16 | 13.0 | 10.0 | 5 | 15 | — | — | 1.3 |
|  | ZnO | 5.0 | 12 | 5 | 0.5 | 2.5 | 2.0 | 13 | 3 | 2.7 | 2.7 | 2.6 |
|  | $Al_2O_3$ | 0.5 | 1 | 1 | 0.5 | 0.5 | 0.9 | 1 | 0.5 | — | — | 1.3 |
|  | $SiO_2$ | — | — | 1 | — | — | 1.0 | 1 | — | — | — | — |
|  | PbO | — | — | — | — | 81.0 | 85.0 | 75 | 81 | — | — | — |
|  | SnO | — | — | — | — | — | — | — | — | 61.5 | 61.5 | 55 |
|  | $SnO_2$ | — | — | — | — | — | — | — | — | 3.3 | 3.3 | 2.5 |
|  | $P_2O_5$ | — | — | — | — | — | — | — | — | 31.4 | 31.4 | 35 |
|  | BaO | — | — | 1 | — | — | — | — | — | — | — | — |
|  | $V_2O_5$ | — | — | — | — | — | — | — | — | — | — | — |
|  | $Sb_2O_3$ | — | — | — | — | — | — | — | — | — | — | 0.3 |
|  | $CeO_2$ | — | 3 | — | 0.5 | 3.0 | 1.1 | 2 | — | — | 1.0 | — |
|  | $Eu_2O_3$ | — | — | — | — | — | — | — | — | 1.1 | — | — |
|  | $Yb_2O_3$ | — | — | — | — | — | — | — | — | — | — | — |
|  | $Fe_2O_3$ | — | 1 | — | — | — | — | 1 | — | — | — | 1.0 |
|  | $MnO_2$ | — | 1 | — | — | 0.3 | — | — | 0.5 | — | — | 1.0 |
|  | $Cr_2O_3$ | — | — | — | — | — | — | — | — | — | — | — |
|  | $Co_2O_3$ | — | — | 0.7 | — | — | — | — | — | — | — | — |
|  | $Ni_2O_3$ | — | — | 0.3 | — | — | — | — | — | — | — | — |
|  | $Nb_2O_5$ | — | — | — | — | — | — | — | — | — | — | — |
|  | $MoO_3$ | — | — | — | — | — | — | 1 | — | — | — | — |
|  | $HfO_2$ | — | — | — | — | — | — | — | — | — | — | — |
|  | $WO_3$ | — | — | — | — | — | — | — | 1 | — | — | — |
|  | $ReO_3$ | 0.5 | — | — | — | — | — | — | — | — | — | — |
|  | $K_2O$ (ppm) | 37 | 25 | 10 | 51 | 5 | 45 | 70 | 65 | 30 | 54 | 72 |
|  | $Li_2O$ (ppm) | At most 5 | At most 5 | At most 5 | At most 5 | At most 5 | At most 5 | At most 5 | At most 5 | At most 5 | At most 5 | At most 5 |
| Softening point (° C.) |  | 428 | 429 | 395 | 410 | 395 | 385 | 415 | 420 | 360 | 363 | 375 |

* Ex.: Example of the present invention, Comp. Ex.: Comparative Example

TABLE 3

|  |  | Ex. 23 | Ex. 24 | Ex. 25 | Ex. 26 | Ex. 27 | Ex. 28 | Comp. Ex. 1 | Comp. Ex. 2 | Comp. Ex. 3 | Comp. Ex. 4 |
|---|---|---|---|---|---|---|---|---|---|---|---|
| Sealing glass/ mass % | $Bi_2O_3$ | — | — | — | — | — | — | 83.0 | 83.0 | — | — |
|  | $B_2O_3$ | 1.5 | 2.0 | — | — | — | — | 5.8 | 5.8 | 13.4 | 13.3 |
|  | ZnO | 3 | 9.7 | 11.9 | 14 | 18.5 | 1.9 | 10.7 | 10.7 | 2.6 | 2.6 |
|  | $Al_2O_3$ | 0.3 | 0.3 | — | — | — | — | 0.5 | 0.5 | 0.5 | 0.5 |
|  | $SiO_2$ | — | — | — | — | — | — | — | — | — | — |
|  | PbO | — | — | — | — | — | — | — | — | 83.5 | 83.1 |
|  | SnO | 65 | 45 | — | — | — | — | — | — | — | — |
|  | $SnO_2$ | 5 | 2 | — | — | — | — | — | — | — | — |
|  | $P_2O_5$ | 25 | 40 | 18.1 | 25 | 20.1 | 15 | — | — | — | — |
|  | BaO | — | — | 3.9 | 10 | — | 9.5 | — | — | — | — |
|  | $V_2O_5$ | — | — | 52.1 | 50 | 60.2 | 70 | — | — | — | — |
|  | $Sb_2O_3$ | — | — | 13.0 | — | — | — | — | — | — | — |
|  | $CeO_2$ | — | — | — | — | 1.2 | — | — | — | — | 0.5 |
|  | $Eu_2O_3$ | — | — | — | 0.7 | — | — | — | — | — | — |
|  | $Yb_2O_3$ | — | — | 1.0 | — | — | — | — | — | — | — |
|  | $Fe_2O_3$ | — | — | — | — | — | 1.0 | — | — | — | — |
|  | $MnO_2$ | — | — | — | 0.3 | — | — | — | — | — | — |
|  | $Cr_2O_3$ | — | — | — | — | — | — | — | — | — | — |
|  | $Co_2O_3$ | — | 1.0 | — | — | — | — | — | — | — | — |
|  | $Ni_2O_3$ | 0.2 | — | — | — | — | — | — | — | — | — |
|  | $Nb_2O_5$ | — | — | — | — | — | — | — | — | — | — |
|  | $MoO_3$ | — | — | — | — | — | — | — | — | — | — |

TABLE 3-continued

|  | Ex. 23 | Ex. 24 | Ex. 25 | Ex. 26 | Ex. 27 | Ex. 28 | Comp. Ex. 1 | Comp. Ex. 2 | Comp. Ex. 3 | Comp. Ex. 4 |
|---|---|---|---|---|---|---|---|---|---|---|
| $HfO_2$ | — | — | — | — | — | — | — | — | — | — |
| $WO_3$ | — | — | — | — | — | — | — | — | — | — |
| $ReO_3$ | — | — | — | — | — | — | — | — | — | — |
| $K_2O$ (ppm) | 55 | 40 | 82 | 41 | 51 | 23 | 1 | 1 | 150 | 1 |
| $Li_2O$ (ppm) | At most 5 | At most 5 | At most 5 | At most 5 | At most 5 | At most 5 | At most 5 | At most 5 | 45 | At most 5 |
| Softening point (° C.) | 350 | 383 | 400 | 410 | 385 | 370 | 406 | 406 | 392 | 393 |

\* Ex.: Example of the present invention, Comp. Ex.: Comparative Example

TABLE 4

|  |  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| Sealing material (vol %) | Sealing glass | Material | Bismuth glass | | | | | | | | |
| | | Blend ratio | 92 | 92 | 92 | 92 | 92 | 92 | 92 | 92 | 92 |
| | Low-expansion filler | Material | Cordierite | | | | | | | | |
| | | Blend ratio | 8 | 8 | 8 | 8 | 8 | 8 | 8 | 8 | 8 |
| Paste (mass %) | Sealing material | | 86 | 86 | 86 | 86 | 86 | 86 | 86 | 86 | 86 |
| | Vehicle | | 14 | 14 | 14 | 14 | 14 | 14 | 14 | 14 | 14 |
| Sealing (heating) temperature (° C.) | | | 430 | 430 | 430 | 430 | 430 | 430 | 430 | 430 | 430 |
| Evaluation results | Metal deposition | | Nil | Nil | Nil | Nil | Nil | Nil | Nil | Nil | Nil |
| | Bond strength | | ○ | ○ | ○ | ○ | ○ | ○ | ○ | ○ | ○ |

\* Ex.: Example of the present invention, Comp. Ex.: Comparative Example

TABLE 5

|  |  |  | Ex. 10 | Ex. 11 | Ex. 12 | Ex. 13 | Ex. 14 | Ex. 15 | Comp. Ex. 1 | Comp. Ex. 2 |
|---|---|---|---|---|---|---|---|---|---|---|
| Sealing material (vol %) | Sealing glass | Material | Bismuth glass | | | | | | | |
| | | Blend ratio | 92 | 92 | 92 | 98 | 87.5 | 95 | 92 | 92 |
| | Low-expansion filler | Material | Cordierite | | | | | | | |
| | | Blend ratio | 8 | 8 | 8 | 2 | 12.5 | 5 | 8 | 8 |
| Paste (mass %) | Sealing material | | 86 | 86 | 86 | 86 | 86 | 86 | 86 | 86 |
| | Vehicle | | 14 | 14 | 14 | 14 | 14 | 14 | 14 | 14 |
| Sealing (heating) temperature (° C.) | | | 430 | 430 | 430 | 430 | 430 | 430 | 430 | 400 |
| Evaluation results | Metal deposition | | Nil | Nil | Nil | Nil | Nil | Nil | Present | Nil |
| | Bond strength | | ○ | ○ | ○ | ○ | ○ | ○ | ○ | x |

\* Ex.: Example of the present invention, Comp. Ex.: Comparative Example

TABLE 6

|  |  |  | Ex. 16 | Ex. 17 | Ex. 18 | Ex. 19 | Comp. Ex. 3 | Comp. Ex. 4 |
|---|---|---|---|---|---|---|---|---|
| Sealing material (vol %) | Sealing glass | Material | Lead glass | | | | | |
| | | Blend ratio | 91 | 85 | 95 | 96 | 91 | 91 |
| | Low-expansion filler | Material | Cordierite | | | | | |
| | | Blend ratio | 9 | 15 | 5 | 4 | 9 | 9 |
| Paste (mass %) | Sealing material | | 85 | 85 | 85 | 85 | 85 | 85 |
| | Vehicle | | 15 | 15 | 15 | 15 | 15 | 15 |
| Sealing (heating) temperature (° C.) | | | 430 | 430 | 430 | 430 | 430 | 430 |
| Evaluation results | Metal deposition | | Nil | Nil | Nil | Nil | Present | Nil |
| | Bond strength | | ○ | ○ | ○ | ○ | ○ | x |

\* Ex.: Example of the present invention

TABLE 7

|  |  |  | Ex. 20 | Ex. 21 | Ex. 22 | Ex. 23 | Ex. 24 |
|---|---|---|---|---|---|---|---|
| Sealing material | Sealing glass | Material | Tin-phosphate glass | | | | |
| | | Blend ratio | 91 | 84 | 87 | 80 | 95 |
| (vol %) | Low-expansion | Material | Zirconium phosphate | | | | |
| | | Blend ratio | 9 | 16 | 13 | 20 | 5 |

TABLE 7-continued

|  |  | Ex. 20 | Ex. 21 | Ex. 22 | Ex. 23 | Ex. 24 |
|---|---|---|---|---|---|---|
|  | filler |  |  |  |  |  |
| Paste (mass %) | Sealing material | 77 | 77 | 77 | 77 | 77 |
|  | Vehicle | 23 | 23 | 23 | 23 | 23 |
| Sealing (heating) temperature (° C.) |  | 430 | 430 | 430 | 430 | 430 |
| Evaluation results | Metal deposition | Nil | Nil | Nil | Nil | Nil |
|  | Bond strength | ○ | ○ | ○ | ○ | ○ |

* Ex.: Example of the present invention

TABLE 8

| Sealing material (vol %) | Sealing glass | Material | Vanadium glass | | | |
|---|---|---|---|---|---|---|
|  |  |  | Ex. 25 | Ex. 26 | Ex. 27 | Ex. 28 |
|  |  | Blend ratio | 86 | 95 | 85 | 80 |
|  | Low-expansion filler | Material | Zirconium silicate | | | |
|  |  | Blend ratio | 14 | 5 | 15 | 20 |
| Paste (mass %) | Sealing material |  | 76 | 76 | 76 | 76 |
|  | Vehicle |  | 24 | 24 | 24 | 24 |
| Sealing (heating) temperature (° C.) |  |  | 430 | 430 | 430 | 430 |
| Evaluation results | Metal deposition |  | Nil | Nil | Nil | Nil |
|  | Bond strength |  | ○ | ○ | ○ | ○ |

* Ex.: Example of the present invention

As evident from Tables 4 to 8, each of the semiconductor devices in Examples 1 to 28 was excellent in the bond strength, and no deposition of metal particles was confirmed. Whereas, in Comparative Examples 1 and 3 wherein sealing glass containing no oxide of the metal M was used, deposition of metal particles was confirmed. Further, in Comparative Example 2 wherein the sealing temperature was lowered relative to Comparative Example 1, although deposition of metal particles was not confirmed, the bond strength was decreased, and the reliability was poor. Further, in Comparative Example 4 wherein the content of $K_2O$ was low, the bond strength was decreased, and the reliability was poor.

INDUSTRIAL APPLICABILITY

The present invention is applicable to production of a semiconductor device employing sealing glass.

This application is a continuation of PCT Application No. PCT/JP2010/062851, filed Jul. 29, 2010, which is based upon and claims the benefit of priority from Japanese Patent Application No. 2009-179234 filed on Jul. 31, 2009. The contents of those applications are incorporated herein by reference in its entirety.

REFERENCE SYMBOLS

1: semiconductor device, 2: semiconductor substrate for an element, 2a, 3a: surface, 3: sealing substrate, 4: element portion, 5: first sealing region, 6: second sealing region, 7: sealing layer, 8: sealing material layer.

What is claimed is:

1. A sealing glass for a semiconductor device, comprising low temperature melting glass having a softening point of at most 430° C., wherein the low temperature melting glass comprises from 0.1 to 5% by mass ratio of an oxide of at least one metal selected from the group consisting of Fe, Mn, Cr, Co, Ni, Nb, Hf, W, Re and rare earth elements, and from 5 to 100 ppm by mass ratio of $K_2O$.

2. The sealing glass for a semiconductor device according to claim 1, wherein the low temperature melting glass has a $Li_2O$ content of at most 30 ppm by mass ratio.

3. The sealing glass for a semiconductor device according to claim 1, wherein the low temperature melting glass contains, by mass ratio, from 70 to 90% of $Bi_2O_3$, from 1 to 20% of ZnO and from 2 to 18% of $B_2O_3$.

4. The sealing glass for a semiconductor device according to claim 1, wherein the low temperature melting glass contains, by mass ratio, from 45 to 68% of SnO, from 2 to 10% of $SnO_2$ and from 20 to 40% of $P_2O_5$.

5. The sealing glass for a semiconductor device according to claim 1, wherein the low temperature melting glass contains, by mass ratio, from 50 to 80% of $V_2O_5$ and from 15 to 45% of $P_2O_5$.

6. The sealing glass for a semiconductor device according to claim 1, wherein the low temperature melting glass contains, by mass ratio, from 75 to 90% of PbO and from 5 to 20% of $B_2O_3$.

7. A sealing material for a semiconductor device, comprising the sealing glass as defined in claim 1, and an inorganic filler in an amount of from 0 to 40% by volume ratio.

8. The sealing material for a semiconductor device according to claim 7, wherein the inorganic filler contains a low-expansion filler comprising at least one member selected from the group consisting of silica, alumina, zirconia, zirconium silicate, aluminum titanate, mullite, cordierite, eucryptite, spodumene, a zirconium phosphate compound, a tin oxide compound and a quartz solid solution.

9. A sealing material paste for a semiconductor device, comprising:
the sealing material as defined in claim 7 and
a vehicle.

10. A semiconductor device comprising:
a semiconductor substrate for an element, having a surface provided with an element portion and a first sealing region;
a sealing substrate having a surface provided with a second sealing region corresponding to the first sealing region, disposed so that the surface faces the surface of the semiconductor substrate for an element; and
a sealing layer comprising a melt-bonded layer of a sealing material formed between the first sealing region of the semiconductor substrate for an element and the second sealing region of the sealing substrate so as to seal the element portion;
wherein the sealing material contains a sealing glass comprising low temperature melting glass having a softening point of at most 430° C., comprising from 0.1 to 5% by mass ratio of an oxide of at least one metal selected from the group consisting of Fe, Mn, Cr, Co, Ni, Nb, Hf, W, Re and rare earth elements, and from 5 to 100 ppm by mass ratio of $K_2O$.

11. A process for producing a semiconductor device, comprising:
a step of preparing a semiconductor substrate for an element having a surface provided with an element portion and a first sealing region provided so as to surround the element portion;
a step of preparing a sealing substrate having a surface provided with a second sealing region corresponding to the first sealing region;
a step of forming a sealing material layer comprising a fired layer of a sealing material on the first sealing region of the semiconductor substrate for an element or the second sealing region of the sealing substrate;

a step of laminating the semiconductor substrate for an element and the sealing substrate via the sealing material layer so that the surface of the semiconductor substrate for an element and the surface of the sealing substrate face each other; and a step of heating the laminate of the semiconductor substrate for an element and the sealing substrate to melt the sealing material layer thereby to form a sealing layer to seal the element portion;

wherein the sealing material contains a sealing glass comprising low temperature melting glass having a softening point of at most 430° C., comprising from 0.1 to 5% by mass ratio of an oxide of at least one metal selected from the group consisting of Fe, Mn, Cr, Co, Ni, Nb, Hf, W, Re and rare earth elements, and from 5 to 100 ppm by mass ratio of $K_2O$.

12. The sealing material paste according to claim 9, wherein the vehicle is methyl cellulose, ethyl cellulose, carboxymethyl cellulose, oxyethyl cellulose, benzyl cellulose, propyl cellulose, or nitrocellulose dissolved in a solvent selected from the group consisting of terpineol, butyl carbitol acetate, and ethyl carbitol acetate.

13. The sealing material paste according to claim 9, wherein the vehicle is methyl (meth)acrylate, ethyl (meth) acrylate, butyl (meth)acrylate or 2-hydroxyethyl methacrylate dissolved in a solvent selected from the group consisting of methyl ethyl ketone, terpineol, butyl carbitol acetate, and ethylcarbitol acetate.

* * * * *